(12) United States Patent
Lenz

(10) Patent No.: US 9,117,870 B2
(45) Date of Patent: Aug. 25, 2015

(54) HIGH THROUGHPUT CLEANER CHAMBER

(75) Inventor: Eric H. Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1048 days.

(21) Appl. No.: 12/145,707

(22) Filed: Jun. 25, 2008

(65) Prior Publication Data

US 2009/0245984 A1    Oct. 1, 2009

Related U.S. Application Data

(60) Provisional application No. 61/040,023, filed on Mar. 27, 2008.

(51) Int. Cl.
  *B08B 3/00* (2006.01)
  *H01L 21/687* (2006.01)
  *H01L 21/67* (2006.01)

(52) U.S. Cl.
  CPC ...... *H01L 21/68764* (2013.01); *H01L 21/6719* (2013.01); *H01L 21/68771* (2013.01)

(58) Field of Classification Search
  CPC ............. H01L 21/6719; H01L 21/68771; H01L 21/68764
  USPC ........... 118/730; 134/137, 140, 142, 153, 157
  See application file for complete search history.

(56) References Cited

U.S. PATENT DOCUMENTS

| 4,851,018 A | 7/1989 | Lazzari et al. |
|---|---|---|
| 4,890,780 A | 1/1990 | Mimata et al. |
| 5,096,364 A | 3/1992 | Messer et al. |
| 5,188,136 A | 2/1993 | Kumagai |
| 5,207,548 A | 5/1993 | Suffel |
| 5,229,615 A | 7/1993 | Brune et al. |
| 5,295,777 A | 3/1994 | Hodos |
| 5,425,793 A | 6/1995 | Mori et al. |
| 5,451,130 A | 9/1995 | Kempf |

(Continued)

FOREIGN PATENT DOCUMENTS

| CN | 1913098 A | 2/2007 |
|---|---|---|
| CN | 101299415 A | 11/2008 |

(Continued)

OTHER PUBLICATIONS

"International Application Serial No. PCT/US2009/001900, International Search Report and Written Opinion mailed Nov. 24, 2009", 14 pgs.

(Continued)

*Primary Examiner* — David Cormier

(57) ABSTRACT

A wafer cleaning chamber comprising a plurality of carrier arms each having concentrically-mounted midpoints between opposing ends of the carrier arms with a wafer carrier mounted on each of the opposing ends of the carrier arms. A hub includes a plurality of concentrically mounted drives where each of the plurality of drives is coupled near the midpoint of a respective one of the plurality of carrier arms. Each of the plurality of drives is configured to be controlled independently of the remaining plurality of concentrically-mounted drives. A respective motor is coupled to each of the concentrically mounted drives and is configured to move the coupled carrier arm in a rotary manner under control of a program containing a velocity profile. At least one cleaning chemical-supply head is positioned proximate to a path of the wafer carriers.

19 Claims, 3 Drawing Sheets

(56) References Cited

U.S. PATENT DOCUMENTS

| | | |
|---|---|---|
| 5,525,106 A | 6/1996 | Iizuka et al. |
| 5,679,405 A | 10/1997 | Thomas et al. |
| 5,765,444 A | 6/1998 | Bacchi et al. |
| 5,843,233 A | 12/1998 | van de Ven et al. |
| 5,951,770 A | 9/1999 | Perlov et al. |
| 5,979,475 A | 11/1999 | Satoh et al. |
| 6,048,162 A | 4/2000 | Moslehi |
| 6,050,891 A | 4/2000 | Nering |
| 6,082,950 A | 7/2000 | Altwood et al. |
| 6,097,469 A | 8/2000 | Yaegashi et al. |
| 6,155,768 A | 12/2000 | Bacchi et al. |
| 6,158,951 A | 12/2000 | Carr et al. |
| 6,186,722 B1 | 2/2001 | Shirai |
| 6,328,872 B1 | 12/2001 | Talieh et al. |
| 6,364,599 B1* | 4/2002 | Suwa et al. ............. 414/744.1 |
| 6,368,183 B1 | 4/2002 | Trojan et al. |
| 6,409,453 B1 | 6/2002 | Brodine et al. |
| 6,429,139 B1* | 8/2002 | Ryan et al. ................ 438/716 |
| 6,485,250 B2 | 11/2002 | Hofmeister |
| 6,561,798 B2 | 5/2003 | Kuznetsov et al. |
| 6,882,416 B1 | 4/2005 | Hunter et al. |
| 7,014,672 B2 | 3/2006 | Ishihara et al. |
| 7,090,741 B2* | 8/2006 | Narushima et al. ...... 156/345.26 |
| 7,255,633 B2 | 8/2007 | Muldowney |
| 7,276,097 B2 | 10/2007 | Edo |
| 7,527,664 B2 | 5/2009 | Jackson |
| 8,007,218 B2 | 8/2011 | Park et al. |
| 8,282,698 B2 | 10/2012 | Lenz |
| 8,562,272 B2 | 10/2013 | Lenz |
| 2002/0061248 A1 | 5/2002 | Tepman |
| 2002/0075478 A1 | 6/2002 | Nulman et al. |
| 2002/0127091 A1 | 9/2002 | Lowrance et al. |
| 2003/0047199 A1 | 3/2003 | Worm |
| 2003/0202865 A1 | 10/2003 | Ponnekanti et al. |
| 2004/0013497 A1 | 1/2004 | Shirai |
| 2004/0076505 A1* | 4/2004 | Kinnard et al. ............ 414/744.2 |
| 2004/0144316 A1 | 7/2004 | Lee et al. |
| 2005/1007038 | 3/2005 | Miyata et al. |
| 2006/0180968 A1 | 8/2006 | Kim et al. |
| 2007/0034479 A1* | 2/2007 | Todaka ................. 198/463.1 |
| 2007/0218197 A1 | 9/2007 | Kurono |
| 2007/0224820 A1 | 9/2007 | Lim et al. |
| 2007/0295274 A1 | 12/2007 | Webb et al. |
| 2008/0031710 A1 | 2/2008 | Moriya et al. |
| 2008/0175694 A1 | 7/2008 | Park et al. |
| 2009/0022571 A1 | 1/2009 | Krupyshev et al. |
| 2009/0081005 A1 | 3/2009 | Miyasaka |
| 2009/0245984 A1 | 10/2009 | Lenz |
| 2011/0200415 A1 | 8/2011 | Lenz |
| 2011/0232771 A1 | 9/2011 | Lenz |
| 2011/0236159 A1 | 9/2011 | Lenz |

FOREIGN PATENT DOCUMENTS

| | | |
|---|---|---|
| CN | 101461051 A | 6/2009 |
| CN | 102770954 A | 11/2012 |
| JP | 237742 A | 2/1990 |
| JP | 3212951 A | 9/1991 |
| JP | 4290454 A | 10/1992 |
| JP | 10242234 A | 9/1998 |
| JP | 200021947 A | 1/2000 |
| JP | 200313223 A | 1/2003 |
| JP | 2003068819 A | 3/2003 |
| JP | 2003229466 A | 8/2003 |
| JP | 2004193418 A | 7/2004 |
| JP | 2004200329 A | 7/2004 |
| JP | 200628577 A | 2/2006 |
| JP | 2013520027 A | 5/2013 |
| KR | 1020020062562 A | 7/2002 |
| KR | 1020070107361 A | 11/2007 |
| KR | 100803559 B1 | 2/2008 |
| WO | WO-0033359 A2 | 6/2000 |
| WO | WO-2007126289 A1 | 11/2007 |
| WO | WO-2007129838 A1 | 11/2007 |
| WO | WO-2008140728 A2 | 11/2008 |
| WO | WO-2009120360 A2 | 10/2009 |
| WO | WO-2011022870 A2 | 8/2011 |
| WO | WO-2011102952 A2 | 8/2011 |
| WO | WO-2011102952 A3 | 8/2011 |
| WO | WO-2011119729 A2 | 9/2011 |
| WO | WO-2011119729 A3 | 9/2011 |
| WO | WO-2011119733 A2 | 9/2011 |
| WO | WO-2011119733 A2 | 9/2011 |
| WO | WO-2011119733 A3 | 9/2011 |

OTHER PUBLICATIONS

"International Application Serial No. PCT/US2009/01900, International Preliminary Report on Patentability mailed Oct. 7, 2010", 8 pgs.
"International Application Serial No. PCT/US2011/022870, International Search Report mailed Oct. 31, 2011", 3 pgs.
"International Application Serial No. PCT/US2011/022870, Written Opinion mailed Oct. 31, 2011", 3 pgs.
"U.S. Appl. No. 12/706,397, Final Office Action mailed Mar. 7, 2013", 10 pgs.
"U.S. Appl. No. 12/706,397, Notice of Allowance mailed Jun. 27, 2013", 8 pgs.
"U.S. Appl. No. 12/706,397, Response filed Feb. 14, 2013 to Non Final Office Action mailed Nov. 16, 2012", 10 pgs.
"U.S. Appl. No. 12/706,397, Response filed Jun. 7, 2013 to Final Office Action mailed Mar. 7, 2013", 9 pgs.
"U.S. Appl. No. 12/730,868 , Response filed May 29, 2013 to Final Office Action mailed Dec. 31, 2012", 18 pgs.
"U.S. Appl. No. 12/730,868, Final Office Action mailed Dec. 31, 2012", 11 pgs.
"U.S. Appl. No. 12/730,880 , Response filed May 17, 2012 to Non Final Office Action mailed Feb. 24, 2012", 17 pgs.
"U.S. Appl. No. 12/730,880, Non Final Office Action mailed Feb. 24, 2012", 7 pgs.
"U.S. Appl. No. 12/730,880, Notice of Allowance mailed Jun. 7, 2012", 8 pgs.
"International Application Serial No. PCT/US2011/029623, International Search Report mailed Nov. 28, 2011", 3 pgs.
"International Application Serial No. PCT/US2011/029623, Written Opinion mailed Nov. 28, 2011", 3 pgs.
"International Application Serial No. PCT/US2011/029628, International Search Report mailed Nov. 30, 2011", 3 pgs.
"International Application Serial No. PCT/US2011/029628, Written Opinion mailed Nov. 30, 2011", 3 pgs.
"U.S. Appl. No. 12/706,397, Preliminary Amendment filed Jul. 26, 2012", 9 pgs.
"U.S. Appl. No. 12/730,868, Non Final Office Action mailed Oct. 1, 2012", 12 pgs.
"U.S. Appl. No. 12/730,868, Response filed Dec. 7, 2012 to Non Final Office Action mailed Oct. 1, 2012", 15 pgs.
"European Application Serial No. 09724813.2, Extended Search Report mailed Nov. 7, 2012", 8 pgs.
"International Application Serial No. PCT/US2011/022870, International Preliminary Report on Patentability mailed Aug. 30, 2012", 5 pgs.
"International Application Serial No. PCT/US2011/029623, International Preliminary Report on Patentability mailed Oct. 4, 2012", 5 pgs.
"International Application Serial No. PCT/US2011/029628, International Preliminary Report on Patentability mailed Oct. 4, 2012", 5 pgs.
"Japanese Application Serial No. 2012-553922, Voluntary Amendment filed Nov. 8, 2012", 4 pgs.
Translation of the Notification of Examination Opinions for Taiwan Patent Application No. 98110123 dated Mar. 31, 2014, 7 pages.
"U.S. Appl. No. 12/706,397, Non Final Office Action mailed Nov. 16, 2012", 11 pgs.
"U.S. Appl. No. 12/706,397, Supplemental Preliminary Amendment filed Sep. 10, 2012", 5 pgs.
"International Application Serial No. PCT/US2009/001900, International Written Opinion mailed Nov. 24, 2009", 4 pgs.
Notification of Office Action received for Chinese Patent Application No. 201180011174.2 mailed Oct. 10, 2014, 2 pages.

* cited by examiner

HIGH THROUGHPUT CLEANER CHAMBER

CROSS-REFERENCE TO RELATED APPLICATION

This application claims priority from U.S. Provisional Patent Application Ser. No. 61/040,023 entitled "High Throughput Cleaner Chamber," filed Mar. 27, 2008, which is hereby incorporated by reference in its entirety.

TECHNICAL FIELD

The present invention relates generally to the field of process equipment used in the semiconductor, data storage, flat panel display, as well as in allied or other industries. More particularly, the present invention relates to a rotary-stage wafer handler located within a cleaning chamber.

BACKGROUND

Semiconductor device geometries (i.e., integrated circuit design rules) have decreased dramatically in size since such devices were first introduced several decades ago. Integrated circuits (ICs) have generally followed "Moore's Law," meaning that the number of devices which will fit on a single integrated circuit chip doubles every two years. Today's IC fabrication facilities routinely produce 65 nm (0.065 µm) feature size devices, and future fabs will soon be producing devices having even smaller feature sizes.

Not surprisingly, semiconductor integrated circuit fabrication is a complicated process involving a coordinated series of accurate, precise, and repeatable operations. During the fabrication operations, surfaces of a semiconductor substrate (e.g., a semiconductor wafer) become contaminated with layers of residue comprised of particulates, organic materials, metallic impurities (e.g., copper (Cu), aluminum (Al), titanium (Ti), and tungsten (W)), and native oxides (e.g., silicon dioxide).

An increasingly important task in semiconductor processing is the cleaning and preparation of the wafer surface prior to subsequent processing steps. A goal of this cleaning is to remove contaminants and native oxides from wafer surfaces. Wafer cleaning is, in fact, the most frequently repeated operation in integrated circuit fabrication and is one of the most important segments in the semiconductor-equipment business. However, each integrated circuit device generation becomes increasingly difficult to properly clean.

For example, roughly 20% of all process steps in a contemporary fab are cleaning steps. The percentage of cleaning steps continues to increase with each advance in design rules. While the number of cleanings increases, the requirement levels for impurity concentrations, particle size and quantity, water and chemical usage, and the amount of surface microroughness continues to increase as well. Not only is wafer cleaning needed now before each new process sequence, but also additional steps are often required to clean fab process tools after a production run.

Two major types of cleaning processes exist: wet cleaning methods and dry cleaning methods. Liquid chemical cleaning processes, generally referred to as wet cleaning, rely on a combination of solvents, acids, and water to spray, scrub, etch, and dissolve contaminants from the wafer surface. Dry cleaning processes use gas phase chemistry, and rely on chemical reactions required for wafer cleaning, as well as other techniques such as lases, ions, aerosols, and ozonated chemistries. Generally, dry cleaning methods use fewer chemicals and are less hazardous for the environment but usually do not perform as well as wet methods, especially for particle removal.

For wet-chemical cleaning methods, the RCA clean, developed in 1965, still forms the basis for most front-end-of-line (FEOL) wet cleans. A typical RCA-type cleaning sequence starts with the use of a sulfuric acid/hydrogen peroxide ($H_2SO_4/H_2O_2$, commonly called a "piranha etch") solution followed by a dip in diluted hydrofluoric acid (HF). A standard clean first operation ("SC-1 clean") uses a solution of ammonium hydroxide/hydrogen peroxide/water ($NH_4OH/H_2O_2/H_2O$, also known as a "base piranha") to remove particles, while a standard clean second operation ("SC-2 clean") uses a solution of hydrochloric acid/hydrogen peroxide/water ($HCl/H_2O_2/H_2O$) to remove metals. Despite increasingly stringent process demands and enhanced improvements in analytical techniques, cleanliness of chemicals, and deionized (DI) water, the basic cleaning recipes have remained generally unchanged since the first introduction of this cleaning technology. Since environmental concerns and cost-effectiveness were not a major issue 40 years ago, the RCA cleaning procedure is far from optimal in these respects and must therefore be applied efficiently and cost-effectively.

Perhaps more importantly, from a yield and cost basis standpoint, the type of equipment used in the clean process is becoming a primary driver. The clean process must be effective, but it must also be fast. Contemporary throughput demands for current generation 300 mm wafers are 360 wafers per hour. Presently, systems use a linear wafer motion requiring a non-productive time period while the wafer carrier is returned to the starting point in a wafer cleaning tool. Thus, wafer handling is slow. Proposed solutions to increase throughput have focused on joining a plurality of cleaning tools in parallel. While such solutions increase substrate throughput, they do so at the expense of tool footprint, increased equipment cost, and reduced reliability.

Currently available semiconductor substrate cleaning equipment suffers from a high cost-per-unit of wafer cleaned, a high cost-of-ownership, a lack of scalability, and an inability to easily adapt to various processing sequences or to increases in semiconductor wafer sizes. Among the many factors that contribute to wafer cleaning costs, the capital cost of wafer handlers which move semiconductor wafers between various locations presents a significant expense. Accordingly, improvements are needed in the field of semiconductor wafer cleaning with a special emphasis on equipment reliability, throughput, and efficiency.

SUMMARY

In an exemplary embodiment, a substrate carrier system is disclosed. The substrate carrier system comprises a plurality of carrier arms, each having a midpoint located between opposing ends of the arm. The plurality of carrier arms further has at least one substrate carrier mounted on each of the opposing ends of the carrier arms. A hub includes a plurality of concentrically mounted drives. Each of the plurality of drives is coupled near the midpoint of a respective one of the plurality of carrier arms and is configured to be controlled independently of the remaining plurality of concentrically mounted drives. A drive motor is coupled to each of the concentrically mounted drives and is configured to move the coupled carrier arm in a rotary manner.

Another exemplary embodiment discloses a method of programming a substrate carrier system having n drive motors where each of the n drive motors is coupled to an independent rotary substrate carrier. The method comprises constructing a base velocity profile for programming a first of the n drive motors including the steps of programming a first time period to accelerate the first drive motor, programming a second time period to negatively accelerate the first drive motor, programming a third period to maintain the first drive motor at a constant velocity, programming a fourth time period to accelerate the first drive motor, programming a fifth time period to negatively accelerate the first drive motor, and programming a sixth time period to maintain the first drive motor in a fixed position. The base velocity profile is applied to a program controlling the first of the n drive motors to provide motion to a first of the independent rotary substrate carriers.

Another exemplary embodiment discloses a processor-readable storage medium storing an instruction. When the instruction is executed by a processor, the instruction causes the processor to perform a method of programming a substrate carrier system having n drive motors where each of the n drive motors is coupled to an independent rotary substrate carrier. The method comprises constructing a base velocity profile for programming a first of the n drive motors including the steps of programming a first time period to accelerate the first drive motor, programming a second time period to negatively accelerate the first drive motor, programming a third period to maintain the first drive motor at a constant velocity, programming a fourth time period to accelerate the first drive motor, programming a fifth time period to negatively accelerate the first drive motor, and programming a sixth time period to maintain the first drive motor in a fixed position. The base velocity profile is applied to a program controlling the first of the n drive motors to provide motion to a first of the independent rotary substrate carriers.

In another exemplary embodiment, a wafer cleaning chamber is disclosed. The chamber comprises a plurality of carrier arms each having concentrically-mounted midpoints located between opposing ends of the carrier arms with a wafer carrier mounted on each of the opposing ends of the carrier arms. A hub includes a plurality of concentrically mounted drives where each of the plurality of drives is coupled near the midpoints of a respective one of the plurality of carrier arms. Each of the plurality of drives is configured to be controlled independently of the remaining plurality of concentrically mounted drives. A motor is coupled to each of the concentrically mounted drives and is configured to move the coupled carrier arm in a rotary manner under control of a program containing a velocity profile. At least one cleaning chemical-supply head is positioned proximate to a path of the wafer carriers.

BRIEF DESCRIPTION OF THE DRAWINGS

The appended drawings illustrate exemplary embodiments only of the present invention and must not be considered as limiting its scope.

DETAILED DESCRIPTION

Figure 1:
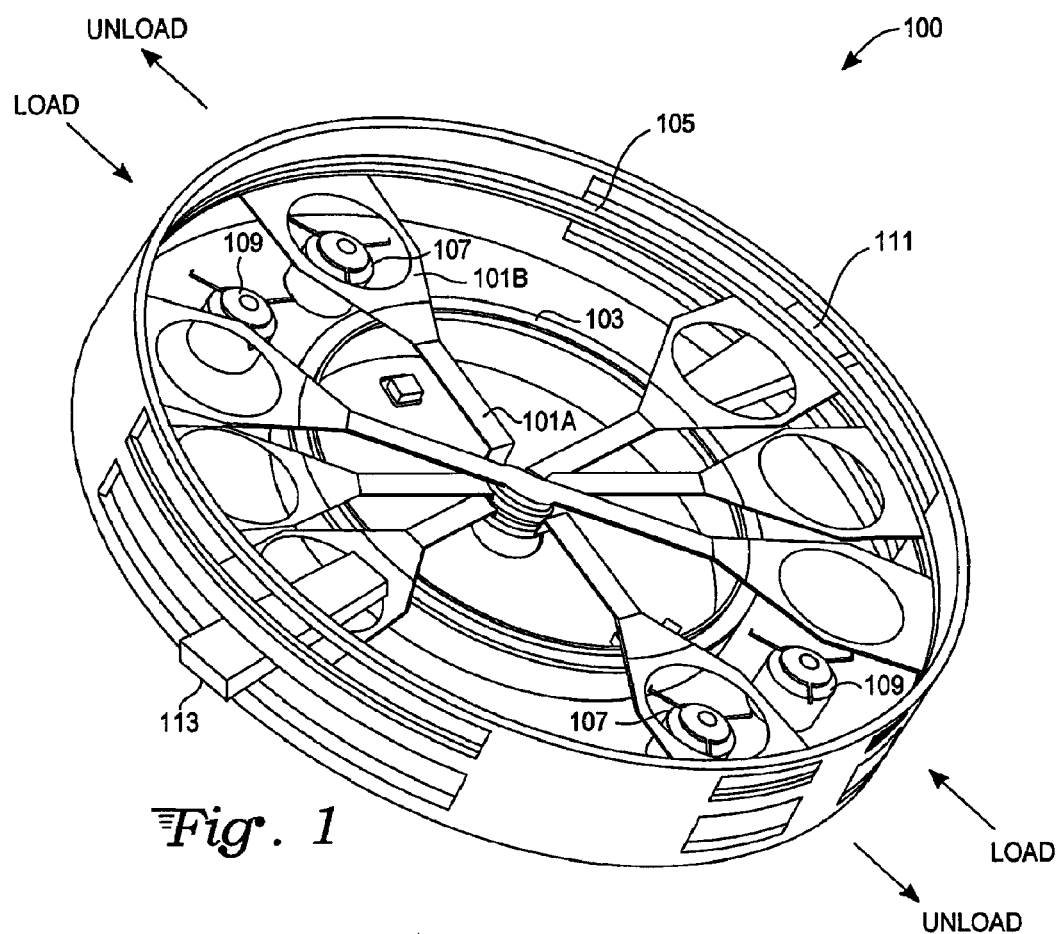
FIG. 1 is a three-dimensional representation of an exemplary clock arm wafer carrier system in accordance with the present invention.

With reference to FIG. 1, an exemplary clock arm wafer carrier system 100 includes a plurality of rotary arms 101A, each having an associated wafer carrier 101B, an inner track section 103, an outer track section 105, a plurality of unload station wafer lifters 107, and a plurality of load station wafer lifters 109. Generally, the exemplary clock arm wafer carrier system 100 is maintained as an isolated chamber environment with appropriate fume head type isolation and cleanroom filtering and flow incorporated internally as needed.

Each of the plurality of rotary arms 101A is independently driven and, thus, may be started, stopped, and accelerated independently of the remaining plurality of rotary arms 101A. Although the exemplary clock arm wafer carrier system 100 shows four rotary arms 101A, a skilled artisan will quickly recognize that any number of arms may be utilized and scaled as necessary to adapt to a given wafer size.

Also, each of the wafer carriers 101B may be adapted to accommodate other wafer sizes or substrate types. For example, the wafer carriers 102B may be designed to accommodate 300 mm silicon wafers or 100 mm gallium arsenide (GaAs) wafers. Therefore, as used herein, the term "wafer" is simply chosen as a convenient term referring to any of various substrate types used in the semiconductor and allied industries. Substrate types may therefore include silicon wafers, compound wafers, thin film head assemblies, photomask blanks and reticles, or numerous other types of substrates known in the art. Specific details related to the rotary arm connection to the wafer carriers are discussed with reference to FIG. 3, below.

In a specific exemplary embodiment, the outer track section 105 is physically arranged to accommodate a 30 inch radius from the midpoints of the rotary arms 101A to the center of the wafer carrier 101B. The outer track section 105, of course, can be sized appropriately depending upon the number of rotary arms employed and the size of the substrates handled.

The plurality of wafer lifters 107, 109 may be of any general type commonly known and used in the semiconductor industry. As shown, two load station lifters 109 are spaced approximately 180° apart from one another. Similarly, two unload station lifters 107 are spaced apart approximately 180°. In other embodiments (not shown), there may only a single pair of wafer lifters 107, 109 either with or without a wafer return track though a center portion of the carrier system. Alternatively, in still other embodiments (not shown), a higher number of wafer lifters 107, 109 may be used.

In general operation, once the wafer carrier 101B is positioned over one of the lifters 107, 109, an external robot (not shown) may place a wafer to or from a wafer carrier (e.g., a wafer boat or front opening unified pod (FOUP)) onto one of the lifters 107, 109. The lifter 107, 109 then lowers the wafer onto to the wafer carrier 101B and the lifter 107, 109 continues to lower far enough to avoid any collisions with any of the rotating wafer arms 101A.

With continued reference to FIG. 1, the exemplary clock arm wafer carrier system 100 further includes an upper chemical-release head 111 and a lower chemical-release head 113 situated so as to spray or otherwise apply chemicals (e.g., such as various combinations of the cleaning chemicals mentioned above) as a wafer passes in proximity to the upper 111 and lower 113 chemical-release heads. Utilizing at least two heads allows chemicals to be applied to both sides of a wafer in a single pass. Alternatively, the upper 111 and lower 113 chemical-release heads may be arranged to simultaneously apply chemicals to both sides of a wafer. As will be recognizable to a skilled artisan, any number of chemical-release heads may be utilized.

In a specific exemplary embodiment, the upper 111 and lower 113 chemical-release heads are designed in a "pie-section" shape having a wider cross-sectional width at the outer periphery of the carrier system 100 than at its inner periphery. The pie-section shape accommodates the higher angular velocity on the outermost portion of the wafer as compared with the inner portion. Thus, more chemicals may be delivered to the wafer's outer portion through, for example, an increased number of spray nozzles directed at the wafer to insure uniform chemical coverage over the face of the wafer.

Therefore, the exemplary clock arm wafer carrier system 100 provides for continuous flow manufacturing and lends itself to processing without gaps between wafers. As noted above, wet chemical cleaning can involve a number of various steps. Starting and stopping wet chemistry is hard to control, wasteful, and inefficient. The exemplary clock arm wafer carrier system 100 processes wafers in a continuous mode by having the wafer carrier travel in a full 360° arc. Unlike the prior art which runs a linear system requiring a 180° return in which no wafer cleaning or processing occurs, the exemplary clock arm wafer carrier system 100 may run parallel cleaning processes on opposing sides of a the clock system 100 simultaneously. Consequently, chemical control can be shared, thereby reducing control system overhead and redundant circuitry. As such, chemical savings can be as much as 300% (i.e., a four-time reduction in chemical usage) from contemporary linear systems.

Two parallel processes thus occur simultaneously: chemical control and wafer motion. As described in more detail with reference to FIGS. 2 and 4, below, independent control of the wafer carrier 101B velocities and accelerations allows for an exit step and for loading and unloading the wafer. The independent control further allows a carrier to accelerate to catch up in a process flow once a carrier has been loaded or unloaded, also described in more detail with reference to FIG. 4, below.

Figure 2:
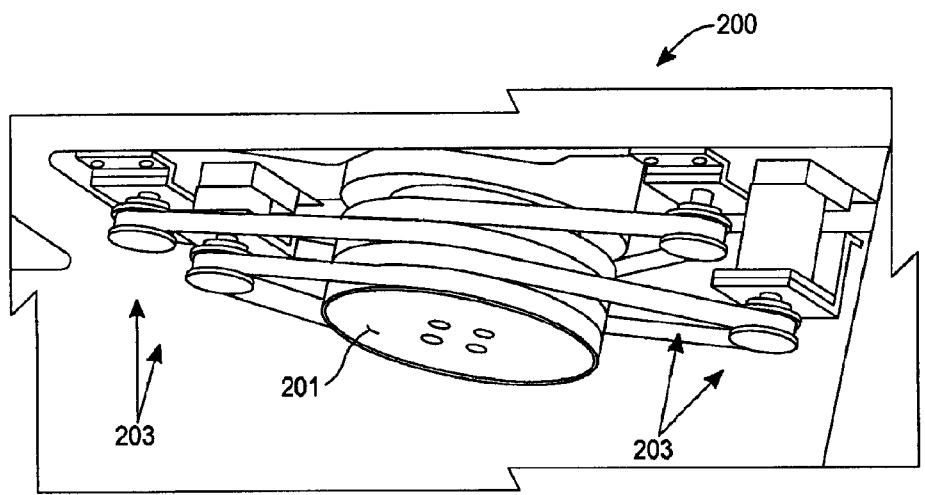
FIG. 2 is a three-dimensional representation of an exemplary motion drive hub providing driving force for the wafer carrier system of FIG. 1.

With reference to FIG. 2, an exemplary rotary drive system 200 includes a hub containing four concentrically mounted arm drive gears 201, one for each of the rotary arms 101A (FIG. 1). Four motors 203 are employed, one for each of the concentrically mounted arm drive gears 201. Each of the rotary arms 101A can be individually driven by employing a separate motor 203 for each of the rotary arms 101A. An exemplary velocity profile is described with reference to FIG. 4, below.

Drive power is transferred from each of the motors 203 to the respective arm drive gears 201 by, for example, a belt. The belt drive system enhances overall system efficiency over alternative systems such as gear drives. Further, the balanced overall system design (e.g., the symmetrically designed rotary arms 101A) allows for very low power consumption per each of the four drive motors 203. In this exemplary embodiment, typical power consumption is only 4.5 watts per motor. A skilled artisan will recognize that other types of rotary drive schemes may be employed as well.

In a specific exemplary embodiment, each of the motors 203 may be a standard NEMA 23 frame dimensions such as an SM2315D servo motor with an integral encoder (available from Animatics Corporation, 3200 Patrick Henry Drive, Santa Clara, Calif.). The motor 203, in this embodiment, is based on a fully-integrated, closed loop servo technology and may incorporate internal, non-volatile memory allowing velocity profile programs to be downloaded from a host computer and saved independently to each motor 203. Further, in this specific exemplary embodiment, all input, output, and internal status information is accessible through defined variables for program monitoring and control. Gear reduction may be accomplished with a 50:1 planetary reducer and a 4:1 drive belt reduction thus providing 400,000 counts per revolution with a 2000 encoder count per revolution stepper motor. This specific exemplary embodiment allows for a maximum speed of approximately 1 meter/second and a maximum acceleration of 0.1 g or 0.98 meters/second$^2$. Accordingly, the rotary arms 101A (FIG. 1) move at a maximum angular velocity of approximately 12.5 revolutions per minute.

Figure 3:
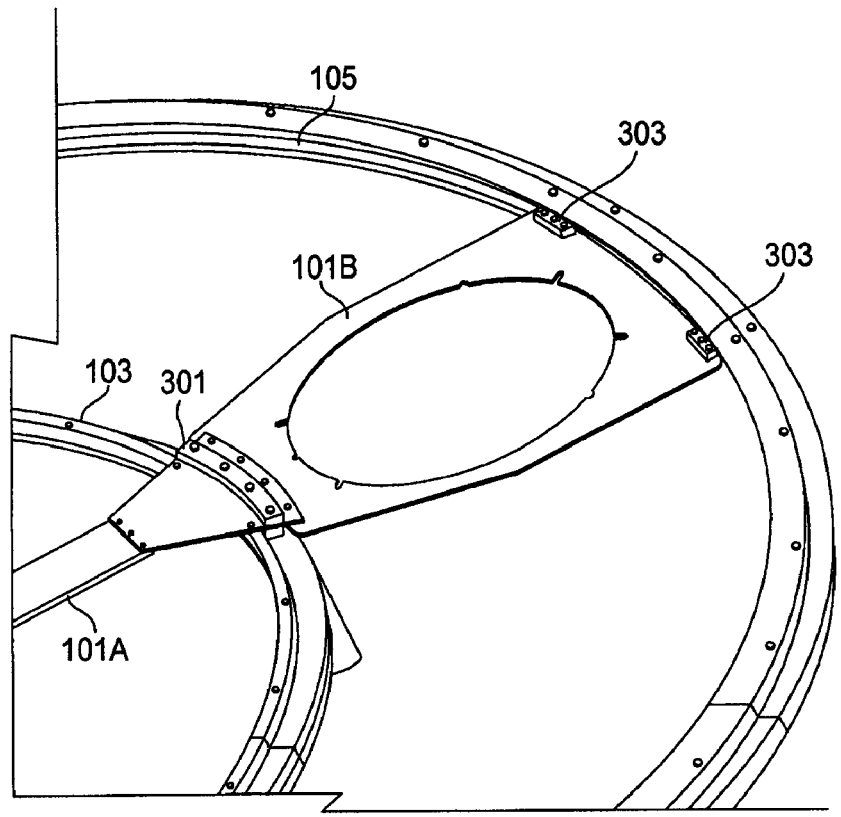
FIG. 3 is a three-dimensional representation of an exemplary arm connection and tracking system of the wafer carrier system of FIG. 1.

Referring now to FIG. 3, a detailed view of the exemplary clock arm wafer carrier system 100 of FIG. 1 includes a flex spring arm/carrier connector 301, positioned at each end of the rotary arm 101A, and one or more outer trucks 303 positioned at the outer edge of the wafer carrier 101B adjacent the outer track section 105.

In a specific exemplary embodiment, the flex spring arm/carrier connector 301 has a load design at 0.3 pound-force with a 3° angle down off the end of the rotary arm 101A allowing for a zero moment at the flex spring arm/carrier connector 301 and 1.2 inch-pounds of applied torque at the rotary arm 101A. The flex spring arm/carrier connector 301 rides beneath the inner track section 103. The wafer carrier 101B continues on at approximately a 0° angle (i.e., substantially horizontally). Two outer trucks are utilized with spring contact of approximately 0.12 pound-force on both the upper and lower sides of the outer track section 105. Followers (not shown specifically in FIG. 3) mounted to the flex spring arm/carrier connector 301 and the outer trucks are fabricated from a chemically-resistant ultra-high molecular weight (UHMW) polyethylene.

In alternative exemplary embodiments, the followers are fabricated from bearing-grade Torlon® plastic. Alternatively, the followers may be fabricated from other materials possessing certain mechanical characteristics such as, depending upon a given application, good strength and impact resistance, creep resistance, dimensional stability, radiation resistance, and chemical resistance. Various materials such as polyamides, polyimides, and acetals, may all be suitable. High temperature-specific plastics and other related materials are generally not required in cleaning applications.

In still other exemplary embodiments, the followers may be machined from a variety of materials including Vespel®, Celcon®, Delrin®, Teflon®, Arlon® plastics, or other materials such as fluropolymers, polytetrafluoroethylenes, and polyetheretherketones (PEEK) having a low coefficient of friction and low particle shedding.

Figure 4:
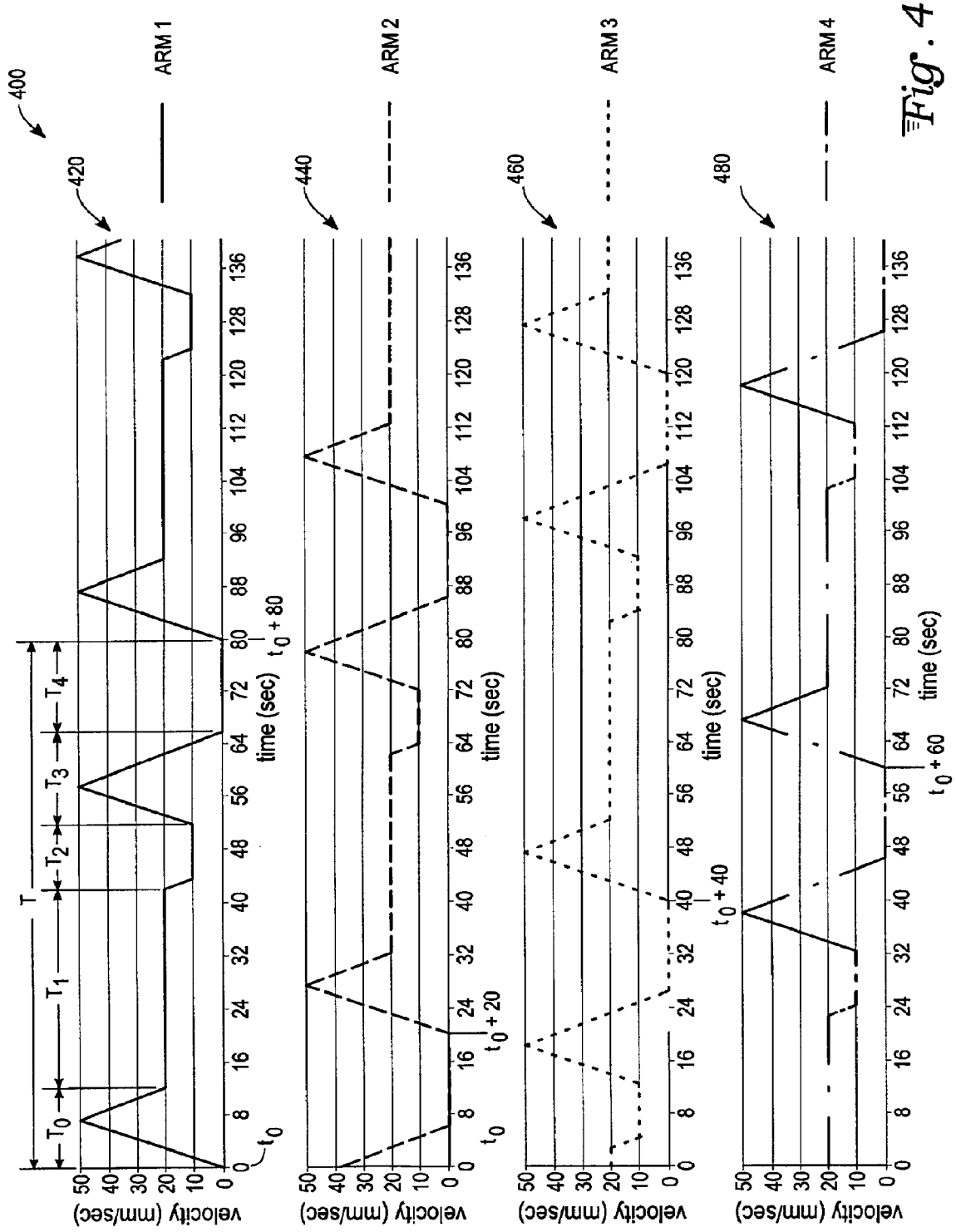
FIG. 4 is an exemplary velocity profile graph used to drive the wafer carrier system of FIG. 1.

With reference to FIG. 4, an exemplary velocity profile graph 400 of the rotary arms depicts arm velocity, as measured at the center of the wafer, plotted as a function of time for the first 420, second 440, third 460, and fourth 480 rotary arm profiles of the exemplary clock arm wafer carrier system 100 of FIG. 1. Each of the velocity profiles is similar except for a temporal offset of 20 seconds indicating when each of the rotary arms 101A begins its accompanying cyclical velocity profile in relation to the first rotary arm. For example, the second rotary arm profile 440 "starts" its velocity profile at a time of $t_0=20$ seconds in relation to the first profile 420.

Each of the velocity profiles further possesses a similar five-period cycle. For example, an entire cycle from the first load to the second load on the same arm is completed after a time period, T, of 80 seconds. During a first time period, $T_0$, the first rotary arm accelerates to a maximum velocity of approximately 50 mm/second and then settles to a constant velocity of 20 mm/second after 12 seconds. The acceleration phase allows the first rotary arm to keep ahead of the subsequent, or second, rotary arm, thus avoiding potential collisions. During a second time period, $T_1$, the first rotary arm continues at a constant velocity of approximately 20 mm/second for roughly 30 seconds. During a latter portion of the second time period, the first rotary arm is moving under a spray head as depicted in FIG. 1. The first rotary arm slows down slightly to 10 mm/second during the latter portion of the third time period, $T_2$. The decreased velocity occurs during a rinse/dry step to improve wafer drying. Compensating for the reduced velocity of period $T_2$, the first rotary arm again accelerates to 50 mm/second during a portion of the fourth time period $T_3$. The first rotary arm is then stopped during time period $T_4$ for a load/unload cycle, and the process repeats itself. A similar process continues concurrently with the other three rotary arms.

Table 1, below, indicates a positional location of a center point of the wafer on the first rotary arm after each of the time periods described immediately above.

TABLE 1

| Time Period | Distance Traveled at End of Period (mm) | Total Distance Traveled (mm) | Angular Location (Assumes R = 404 mm) |
|---|---|---|---|
| $T_0$ | 260 | 260 | 39.60° |
| $T_1$ | 600 | 860 | 115.2° |
| $T_2$ | 90 | 950 | 129.6° |
| $T_3$ | 320 | 1270 | 180.0° |
| $T_4$ | 0 | 1270 | 180.0° |

The present invention is described above with reference to specific embodiments thereof. It will, however, be evident to a skilled artisan that various modifications and changes can be made thereto without departing from the broader spirit and scope of the present invention as set forth in the appended claims. For example, particular embodiments describe a number of material types and locations of various elements of the exemplary clock arm wafer carrier system. A skilled artisan will recognize that these materials and particular elements are flexible and are shown herein for exemplary purposes only in order to fully illustrate the novel nature of the system. Additionally, a skilled artisan will further recognize that various loading configurations of the wafer onto the arm are possible such as building the load robot into the rotary arm rather than relying upon an external robot. Additionally, various motor types may be used such as stepper motors. Also, a plurality of substrate carriers may be mounted on each opposing end of the rotary arms as opposed to a single carrier as described above. Further, the system may be used on a variety of, for example, process, metrology, and analytical tools within a fab. Thus, the system has applications that extend beyond cleaning substrates. Moreover, the term semiconductor should be construed throughout to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A substrate carrier system, comprising:
   a plurality of carrier arms each having a midpoint between opposing ends of the carrier arm, the plurality of carrier arms further having at least one respective substrate carrier mounted on each end of the carrier arm,
   a hub including a plurality of concentrically mounted drives, each of the plurality of drives being coupled near the midpoint of a respective one of the plurality of carrier arms, the plurality of drives being configured to move respective ones of the plurality of carrier arms in at least a full 360° arc in either direction simultaneously, each of the plurality of drives further configured to be controlled independently of the remaining plurality of concentrically mounted drives; and
   a respective drive motor coupled to each of the concentrically mounted drives and configured to move the coupled carrier arm in a rotary manner,
   wherein each of the drive motors is programmed with a respective velocity profile, and wherein (i) each of the respective velocity profiles includes predetermined variations in velocity and (ii) each of the respective velocity profiles is a same velocity profile that is temporally offset from each of the other respective velocity profiles.

2. The substrate carrier system of claim 1 further comprising at least one load/unload port positioned proximal to an outer periphery of the substrate carriers.

3. The substrate carrier system of claim 2 further comprising a lifter station positioned beneath a circular path traversed by midpoints of the substrate carriers and positioned on a radial line between the midpoint of the plurality of carrier arms and the at least one load/unload port.

4. The substrate carrier system of claim 1 wherein each of the drive motors is a stepper motor.

5. The substrate carrier system of claim 1 wherein each of the drive motors is a servo motor.

6. The substrate carrier system of claim 1 further comprising at least one chemical-supply head.

7. The substrate carrier system of claim 6 wherein the at least one chemical-supply head is positioned above a path of the substrate carriers.

8. The substrate carrier system of claim 6 wherein the at least one chemical-supply head is positioned below a path of the substrate carriers.

9. The substrate carrier system of claim 6 wherein the at least one chemical-supply head has a wider cross-sectional width at an outer periphery of the head than at an inner periphery of the head.

10. A substrate carrier system, comprising:
    a plurality of carrier arms each having a midpoint between opposing ends of the carrier arm, the plurality of carrier arms further having at least one respective substrate carrier mounted on each end of the carrier arm,
    a hub including a plurality of concentrically mounted drives, each of the plurality of drives being coupled near the midpoint of a respective one of the plurality of carrier arms, the plurality of drives being configured to move respective ones of the plurality of carrier arms in at least a full 360° arc in either direction simultaneously, each of the plurality of drives further configured to be controlled independently of the remaining plurality of concentrically mounted drives;
    a respective drive motor coupled to each of the concentrically mounted drives and configured to move the coupled carrier arm in a rotary manner; and
    an inner track section and an outer track section each mounted concentrically with the hub and arranged to respectively support an inner and outer periphery of each of the substrate carriers.

11. The substrate carrier system of claim 10 wherein the outer periphery of each of the substrate carriers is supported by both a topside portion and a bottom-side portion of the outer track section.

12. The substrate carrier system of claim 10 wherein the inner periphery of each of the substrate carriers is supported by a topside portion of the inner track section.

13. A wafer cleaning chamber, comprising:
a plurality of carrier arms having concentrically-mounted midpoints between opposing ends of the carrier arms, the plurality of carrier arms further having a respective wafer carrier mounted on each of the opposing ends of the carrier arms,
a hub including a plurality of concentrically mounted drives, each of the plurality of drives being coupled near the midpoint of a respective one of the plurality of carrier arms, the plurality of drives being configured to move respective ones of the plurality of carrier arms in at least a full 360° arc in either direction simultaneously, each of the plurality of drives further configured to be controlled independently of the remaining plurality of concentrically mounted drives;
a respective motor coupled to each of the concentrically-mounted drives and configured to move the coupled carrier arm in a rotary manner under control of a program containing a velocity profile;
at least one cleaning chemical-supply head positioned proximate to a path of the wafer carriers; and
at least one of an inner track section and an outer track section mounted concentrically with the hub and arranged to support each of the wafer carriers.

14. The wafer cleaning chamber of claim 13 further comprising at least one load/unload port positioned proximate to an outer periphery of the wafer carriers.

15. The wafer cleaning chamber of claim 14 further comprising a lifter station positioned beneath a circular path traversed by midpoints of the wafer carriers and positioned on a radial line between the midpoint of the plurality of carrier arms and the at least one load/unload port.

16. The wafer cleaning chamber of claim 13 wherein the at least one cleaning chemical-supply head has a wider cross-sectional width at an outer periphery of the head than at an inner periphery of the head.

17. The wafer cleaning chamber of claim 13 wherein each of the motors is programmed with a velocity profile that is temporally offset from a velocity profile of each of the other motors.

18. The wafer cleaning chamber of claim 13 wherein each of the motors is a stepper motor.

19. The wafer cleaning chamber of claim 13 wherein each of the motors is a servo motor.

* * * * *